(12) United States Patent
Oka et al.

(10) Patent No.: US 7,838,388 B2
(45) Date of Patent: Nov. 23, 2010

(54) METHOD FOR PRODUCING SOI SUBSTRATE

(75) Inventors: Satoshi Oka, Annaka (JP); Nobuhiko Noto, Annaka (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 0 days.

(21) Appl. No.: 12/379,938

(22) Filed: Mar. 4, 2009

(65) Prior Publication Data

US 2009/0258474 A1 Oct. 15, 2009

(30) Foreign Application Priority Data

Apr. 10, 2008 (JP) ............... 2008-102586

(51) Int. Cl.
*H01L 21/76* (2006.01)
(52) U.S. Cl. ............... 438/413; 438/799; 257/E21.32; 257/E21.119; 257/E21.212
(58) Field of Classification Search ............... 438/413, 438/799; 257/E21.212, E21.564, E21.567, 257/E21.568, E21.119, E21.112, E21.133, 257/E21.284, E21.285, E21.306, E21.32
See application file for complete search history.

(56) References Cited

U.S. PATENT DOCUMENTS 6,613,676 B1   9/2003   Yonehara et al.
2001/0046746 A1   11/2001   Yokokawa et al.
2003/0159644 A1*   8/2003   Yonehara et al. ............... 117/8
2003/0181001 A1   9/2003   Aga et al.

FOREIGN PATENT DOCUMENTS

| JP | A 11-288858 | 10/1999 |
| JP | A 2000-30995 | 1/2000 |
| JP | A-2001-85649 | 3/2001 |
| JP | A 2003-163193 | 6/2003 |
| JP | A 2003-347176 | 12/2003 |
| WO | WO 03/009386 | 1/2003 |

OTHER PUBLICATIONS

Office Action in Japanese Application No. 2008-102586 issued Sep. 7, 2010 (with partial English translation).

* cited by examiner

*Primary Examiner*—Caridad M Everhart
(74) *Attorney, Agent, or Firm*—Oliff & Berridge, PLC

(57) ABSTRACT

Provided is a method for producing an SOI substrate having a thick-film SOI layer, in which an ion-implanted layer is formed by implanting at least one kind of ion of hydrogen ion and a rare gas ion into a surface of a bond wafer, an SOI substrate having an SOI layer is produced by, after the ion-implanted surface of the bond wafer and a surface of a base wafer are bonded together via an oxide film, delaminating the bond wafer along the ion-implanted layer, heat treatment is performed on the SOI substrate having the SOI layer in a reducing atmosphere containing hydrogen or an atmosphere containing hydrogen chloride gas, and, after the surface of the SOI layer is polished by CMP, a silicon epitaxial layer is grown on the SOI layer of the SOI substrate.

12 Claims, 7 Drawing Sheets

METHOD FOR PRODUCING SOI SUBSTRATE

BACKGROUND OF THE INVENTION

1. Field of the Invention

The present invention relates to a method for producing an SOI substrate, the method in which an epitaxial layer is laid on an SOI layer of an SOI substrate obtained by using an ion-implantation delamination method.

2. Description of the Related Art

As a method for producing a bonded SOI substrate, a method in which an SOI layer is formed into a thin film by grinding and polishing and an ion-implantation delamination method (also called Smart Cut method™) are generally known. Of these methods, the method using grinding and polishing is performed as follows. Two silicon single crystal wafers are bonded together via an oxide film without using an adhesive and, after the bonding strength is enhanced by heat treatment (1000 to 1200° C.), one of the wafers is formed into a thin film. The advantage of this method is that the crystallinity of the SOI layer and the reliability of the buried oxide film are equal to those of a normal silicon single crystal wafer, and the disadvantage thereof is that the SOI layer has limited film thickness uniformity (of the order of ±0.3 μm) and material costs are high because two silicon wafers are used to produce one SOI substrate.

On the other hand, the ion-implantation delamination method is performed as follows. An oxide film is formed on at least one of two silicon single crystal wafers. After at least one kind of ion of hydrogen ion and a rare gas ion is implanted into one main surface of one wafer (a bond wafer) such that an ion-implanted layer (a delaminated layer) is formed inside the wafer, the ion-implanted surface and one main surface of the other silicon single crystal wafer (a base wafer) are brought into intimate contact with each other via the oxide film. Then, the product thus obtained is subjected to heat treatment at 500° C. or higher, whereby separation is performed along the delaminated layer. This method has the advantage that a thin-film SOI substrate having an SOI layer with film thickness uniformity of ±10 nm or less can be produced with ease and material costs can be reduced by reusing the delaminated bond wafer more than once.

Incidentally, a thick-film SOI substrate with an SOI layer having a film thickness of several to several tens of micrometers is a highly useful wafer for use in bipolar devices and power devices. However, it is known that producing a high-quality SOI wafer at low costs is relatively difficult even when the above-described method using grinding and polishing or the ion-implantation delamination method is used.

The reason is as follows. In the case of the method in which an SOI layer is formed into a thin film by grinding and polishing, it is necessary to bond a wafer with an oxide film and a bare wafer together, perform heat treatment at 1100° C. or higher to join them together, and perform grinding and polishing until an intended SOI film thickness is obtained. This requires a complicated process, and it is extremely difficult to improve the SOI film thickness uniformity. On the other hand, in the case of the ion-implantation delamination method, the thickness of an SOI layer is determined by the depth to which ions can be implanted (that is, the accelerating voltage of an ion implanter). Thus, with a commonly-used implanter, since the maximum accelerating voltage thereof is of the order of 200 keV, only an SOI layer having a thickness of the order, at most, of 2 μm can be obtained. Therefore, with this method alone, it is impossible to obtain a thick-film SOI layer thicker than 2 μm.

As a method for obtaining such an SOI substrate having a thick SOI layer, an epitaxial layer is formed on the SOI layer of the SOI substrate obtained by the above-described ion-implantation delamination method so as to make the SOI layer thicker. However, the surface of the just-delaminated SOI layer obtained by the ion-implantation delamination method has a high degree of roughness (P-V value: 50 nm or less). If epitaxial growth is carried out on such a surface, an epitaxial layer of inferior quality with a high degree of roughness or high particle level is undesirably obtained. Therefore, some measures have to be taken against this problem.

To address this problem, JP-A-2001-85649 describes that polishing is performed by CMP after delamination and then epitaxial growth is carried out on the surface thus obtained. However, the above measures have the following drawbacks. When a rough and uneven surface after delamination is polished by the CMP equipment, it takes considerable time to flatten the surface, leading to reduced productivity. In addition, this results in poor film thickness uniformity due to high stock removal. Furthermore, due to poor bonding strength, film exfoliation occurs during CMP polishing, or an SOI substrate having insufficient bonding strength is obtained after epitaxial growth.

SUMMARY OF THE INVENTION

The present invention has been made in view of the problems described above, and an object thereof is to provide a method for producing an SOI substrate, the method by which it is possible to grow a good-quality silicon epitaxial layer on an SOI layer of an SOI substrate obtained by an ion-implantation delamination method, for example, while at the same time increasing the bonding strength of the SOI substrate.

To achieve the above object, an aspect of the present invention provides a method for producing an SOI substrate having a thick-film SOI layer, in which, at least, an ion-implanted layer is formed by implanting at least one kind of ion of hydrogen ion and a rare gas ion into a surface of a bond wafer, an SOI substrate having an SOI layer is produced by, after the ion-implanted surface of the bond wafer and a surface of a base wafer are bonded together via an oxide film, delaminating the bond wafer along the ion-implanted layer, and a thick-film SOI layer is formed by performing heat treatment on the SOI substrate having the SOI layer in a reducing atmosphere containing hydrogen or an atmosphere containing hydrogen chloride gas and, after polishing the surface of the SOI layer by CMP, growing a silicon epitaxial layer on the SOI layer of the SOI substrate.

With the above-described method for producing an SOI substrate, by performing heat treatment in the aforementioned atmosphere on the surface of the SOI layer with a high degree of film thickness uniformity obtained by the ion-implantation delamination method, it is possible to flatten the irregularities on the delaminated surface to a certain extent while maintaining a high degree of film thickness uniformity. This makes it possible to efficiently perform finishing polishing by CMP and achieve intended flatness even in a short polishing time. This helps prevent a degradation of the film thickness uniformity. Since a silicon epitaxial layer is formed on the SOI layer with a high degree of flatness and good film thickness uniformity, it is possible to form a high-quality silicon epitaxial layer with a high degree of flatness.

In addition, since the heat treatment in the producing method of the present invention can flatten the SOI layer while at the same time enhancing the bonding strength of the SOI substrate, it is possible to efficiently prevent exfoliation of the SOI layer not only at the time of polishing by CMP, but also in the process that follows.

Preferably, the heat treatment is performed at 1000° C. or higher.

As described above, by performing the heat treatment at 1000° C. or higher in the producing method of the present invention, it is possible to achieve both an improvement in surface roughness and an enhancement of the bonding strength more reliably.

Preferably, as the heat treatment, first-stage heat treatment performed at 1000 to 1100° C. and second-stage heat treatment performed at a temperature higher than 1100° C. are performed in a continuous manner.

As described above, by performing the first-stage heat treatment at a relatively low temperature, it is possible to perform flattening while preventing the generation of slip dislocation, and then by performing the second-stage heat treatment at a higher temperature, it is possible to enhance the bonding strength of the SOI substrate. In this case, since the surface has already been flattened by the first-stage heat treatment, it is possible to accomplish the second-stage high-temperature heat treatment in a period of time in which no slip dislocation is generated. This makes it possible to produce an SOI substrate, which is free from slip dislocation and has a higher degree of flatness and higher bonding strength. Furthermore, since the two-stage heat treatment can be performed by single heat treatment equipment and, accordingly, can be performed in a continuous manner without the product being taken out of the equipment, it is possible to efficiently perform the two-stage heat treatment without requiring extra process steps.

Preferably, a temperature at which the silicon epitaxial layer is grown is made higher than a temperature of the heat treatment.

As described above, by growing the silicon epitaxial layer at a temperature higher than a temperature of the heat treatment, it is possible to produce the effects similar to those of the above-described two-stage heat treatment. That is, by performing the heat treatment as the above-described relatively low-temperature first-stage heat treatment, flattening is performed while preventing slip dislocation, and a temperature at which the silicon epitaxial layer is grown helps enhance the bonding strength as in the case of the above-described high-temperature second-stage heat treatment. This makes it possible to obtain an SOI substrate with high bonding strength more efficiently.

Preferably, after particle measurement is carried out for the SOI layer of the SOI substrate having the SOI layer polished by CMP so as to determine the quality thereof, for a substrate judged to be a non-defective product, the silicon epitaxial layer is grown on the SOI layer, and for a substrate judged to be a defective product, the surface of the SOI layer is re-polished by CMP, and particle measurement is carried out again for the SOI layer so as to determine the quality thereof.

As described above, by growing the silicon epitaxial layer after the quality of the SOI layer is determined, it is possible to prevent the silicon epitaxial layer from developing a defect caused by an LPD or the like on the SOI layer surface. Moreover, once the silicon epitaxial layer develops a defect, it is difficult to correct the defect. However, with the SOI layer surface on which no silicon epitaxial layer is grown, if it is re-polished, the LPD or the like can be reduced to the extent that the influence thereof on the growth of the silicon epitaxial layer that follows can be ignored. This makes it possible to obtain a good-quality silicon epitaxial layer with almost no defect by a simple and easy method.

As described above, according to the method for producing an SOI substrate of the present invention, by performing heat treatment in a reducing atmosphere containing hydrogen or an atmosphere containing hydrogen chloride gas, the delaminated surface of an SOI substrate produced by the ion-implantation delamination method is flattened to a certain extent while maintaining the film thickness uniformity thereof, and is then polished by CMP. This makes it possible to achieve an SOI layer with a high degree of flatness and film thickness uniformity even with low stock removal in a short polishing time. By growing a silicon epitaxial layer on such an SOI layer, it is possible to grow a silicon epitaxial layer with a high degree of flatness and thereby produce an SOI substrate having a thick-film SOI layer of good quality. Furthermore, by heat treatment performed before polishing by CMP, it is possible to flatten the SOI layer while at the same time enhancing the bonding strength. This makes it possible to efficiently produce the SOI substrate without suffering from exfoliation at the time of polishing.

DETAILED DESCRIPTION OF THE PREFERRED EMBODIMENTS

The development of a method for producing an SOI substrate having a high-quality, thick SOI layer with efficiency has been awaited.

As a result of intensive research, the inventors have found out that it is possible to form a high-quality thick-film SOI layer by growing a silicon epitaxial layer on an SOI layer with a high degree of flatness which is efficiently obtained by performing heat treatment on an SOI substrate delaminated by ion-implantation in a reducing atmosphere containing hydrogen or an atmosphere containing hydrogen chloride gas so as to flatten an SOI layer to a certain extent while at the same time enhancing the bonding strength, and then performing polishing by CMP, and have made this invention.

Hereinafter, with reference to FIG. 1, as an example of an embodiment, a method for producing an SOI substrate of the present invention will be explained in detail. It is to be understood that the present invention is not limited in any way by the embodiment described below.

Figure 1:
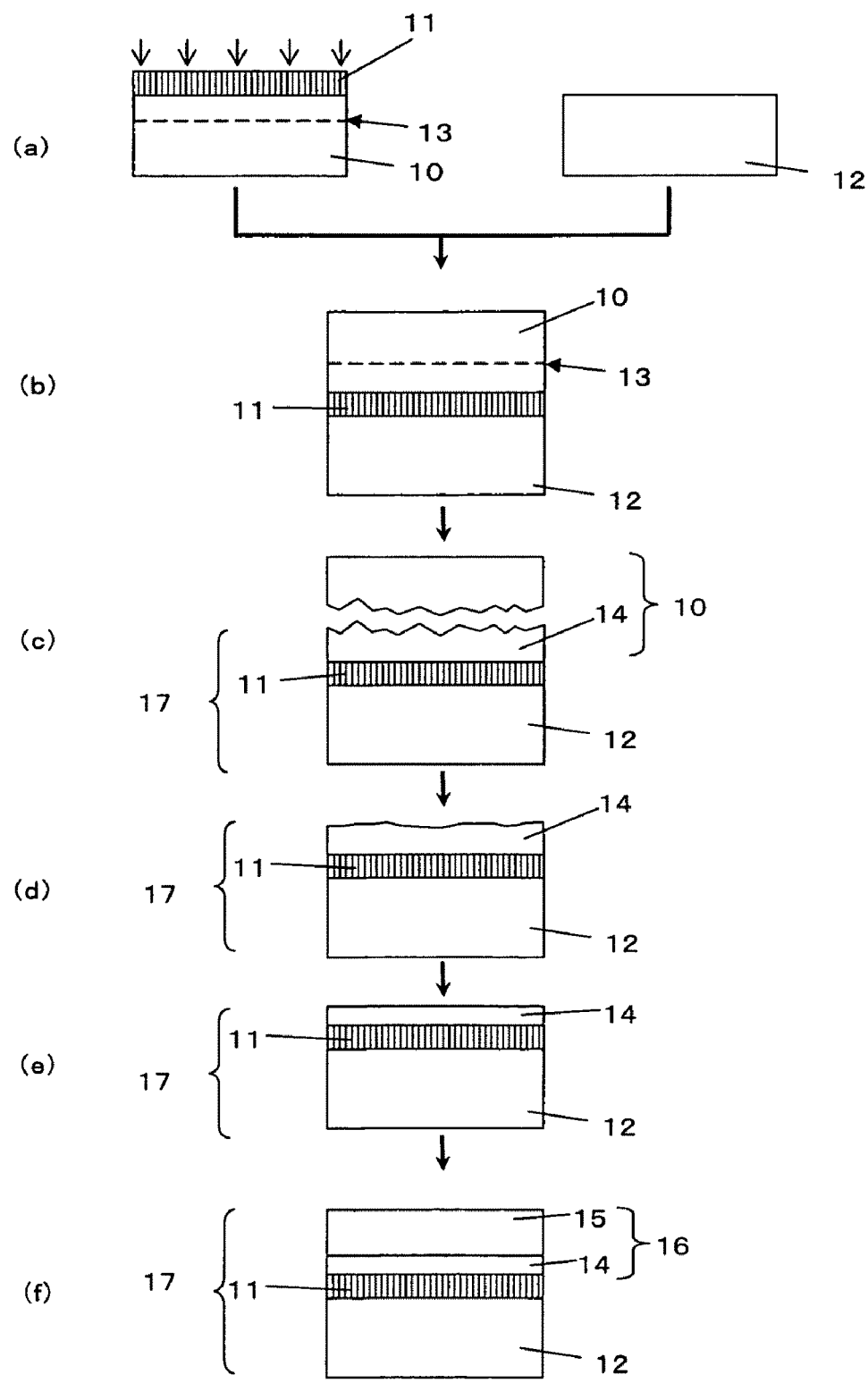
FIG. 1 is a flow diagram of an example of a process of a method for producing an SOI substrate of the present invention.

Incidentally, FIG. 1 is a flow diagram of an example of an embodiment of a method for producing an SOI substrate of the present invention.

First, in a process (a) of FIG. 1, at least one kind of ion of hydrogen ion and a rare gas ion is implanted into a surface of a bond wafer 10 of prepared bond wafer 10 and base wafer 12, the surface at which the bond wafer 10 is to be bonded to the latter, whereby an ion-implanted layer 13 is formed.

At this time, it is possible to appropriately select ion-implantation conditions such as an accelerating voltage, the amount of ions to be implanted, and an implantation temperature so as to achieve an SOI layer of a predetermined thickness. However, since the film thickness of an SOI layer obtained by delamination is determined mainly by the accelerating voltage, and an ion implanter has the accelerating voltage limitations, even when an attempt is made to achieve the thickest possible SOI layer, in the present circumstances, a film thickness of the order of up to 2 µm is obtained by using hydrogen ions, for example, at an accelerating voltage of the order of 200 keV.

As the bond wafer 10 and the base wafer 12 prepared in this case, it is possible to use, for example, a silicon single crystal wafer, which is mirror-polished on both sides.

Although an oxide film 11 is previously formed only on the bond wafer 10 as shown in FIG. 1, the oxide film 11 may be formed only on the base wafer 12 or on both wafers. In addition, the oxide film formed on the wafer may be formed only on a surface to be bonded or on all the surfaces of the wafer including a rear surface.

Next, in a process (b), the bond wafer 10 and the base wafer 12 are bonded together by bringing them into intimate contact with each other via the oxide film 11. By bringing the wafers into intimate contact with each other at room temperature in a clean atmosphere, the wafers are bonded together without using an adhesive or the like. Moreover, by bonding them together after performing plasma treatment on at least one of the surfaces to be bonded before this bonding process, for example, it is possible to enhance the bonding strength.

In a process (c), the bond wafer 10 is delaminated along the ion-implanted layer 13, whereby an SOI substrate 17 having an SOI layer 14 is produced.

The method for delaminating the wafer is not limited to a specific method. For example, when heat treatment for delamination is performed under an inert gas atmosphere at a temperature of about 500° C. or higher, the wafer is delaminated along the ion-implanted layer as a result of crystal rearrangement and the agglomeration of bubbles.

Next, in a process (d), heat treatment is performed on the produced SOI substrate 17 having the SOI layer 14 in a reducing atmosphere containing hydrogen or an atmosphere containing hydrogen chloride gas.

As just described, by performing heat treatment on the delaminated SOI substrate in the above-described atmosphere, it is possible to achieve a largely flattened SOI layer surface, which is a delaminated surface, while maintaining the film thickness uniformity thereof, while at the same time enhancing the bonding strength between the bonded surfaces.

It is preferable that the heat treatment is performed at 1000° C. or higher. As just described, by performing the heat treatment at 1000° C. or higher, it is possible to flatten the SOI layer and enhance the bonding strength more reliably.

More preferably, as the heat treatment, first-stage heat treatment performed at 1000 to 1100° C. and second-stage heat treatment performed at a temperature higher than 1100° C. are performed in a continuous manner.

By performing the first-stage heat treatment at a relatively low temperature, it is possible to flatten the SOI layer while preventing the generation of slip dislocation. After the SOI layer is flattened by the first-stage heat treatment in a manner as described above, by performing the second-stage heat treatment at a high temperature, it is possible to further enhance the bonding strength between the bonded surfaces. The bonding strength can be enhanced in a relatively short time by performing the heat treatment at a high temperature, allowing the second-stage heat treatment to be accomplished in a period of time in which no slip dislocation is generated.

In a process (e), the surface of the SOI layer 14 is polished by CMP (chemical mechanical polishing).

The polishing amount is not limited to a specific amount. It is simply necessary to perform polishing until the surface of the SOI layer is satisfactorily flattened. For example, by polishing the surface of the SOI layer with stock removal of the order of 100 nm, the flatness thereof becomes substantially equal to that of a polished wafer. As the equipment used in this process, it is simply necessary to use commonly-used CMP equipment. Likewise, a polishing pad or polishing slurry used in this process is not limited to a specific polishing pad or polishing slurry, and a conventional polishing pad or polishing slurry can be used.

As described above, in the present invention, since the SOI layer is flattened to a certain extent by heat treatment while maintaining the film thickness uniformity thereof before it is polished by CMP, it is possible to provide the SOI layer with sufficient flatness by performing polishing to a lesser amount. Moreover, since the heat treatment described above helps achieve flattening while at the same time enhancing the bonding strength at the bonded interface, exfoliation is prevented from occurring during polishing, making it possible to perform efficient polishing.

Preferably, after particle measurement is carried out for the SOI layer 14 polished by CMP as described above so as to determine the quality thereof, the substrate judged to be a non-defective product proceeds to the following process (f); for the substrate judged to be a defective product, the SOI layer thereof is re-polished, and particle measurement is carried out again for it so as to determine the quality thereof.

The polished surface of the SOI layer may have a defect such as an LPD (light point defect) resulting from polishing. When an epitaxial layer is grown on the defective SOI layer, a defective silicon epitaxial layer is undesirably formed. For this reason, particle measurement is carried out before the growth of a silicon epitaxial layer so as to determine the quality, and the substrate judged to be a defective product is re-polished, such that a silicon epitaxial layer is grown only on a non-defective product. This makes it possible to form a high-quality silicon epitaxial layer more reliably.

Next, in a process (f), a silicon epitaxial layer 15 is grown on the SOI layer 14 of the SOI substrate 17, whereby a thick-film SOI layer 16 is formed.

Although the method for growing a silicon epitaxial layer is not limited to a specific method, it can be epitaxially grown by commonly-used CVD (chemical vapor deposition) by which Si is precipitated by hydrogen reduction of $SiCl_4$, $SiHCl_3$, $SiH_2Cl_2$, $SiH_4$, or the like, at 1000 to 1200° C., for example.

Alternatively, it can be epitaxially grown by MBE (molecular beam epitaxy) in an ultrahigh vacuum at a low temperature of 600 to 900° C.

According to the producing method of the present invention, it is possible to grow a silicon epitaxial layer on an SOI layer with a high degree of flatness and with less defects, making it possible to form a good-quality silicon epitaxial layer with a high degree of flatness. This makes it possible to produce an SOI substrate having a high-quality thick-film SOI layer.

Moreover, in this case, it is preferable that the silicon epitaxial layer 15 is grown at a temperature higher than the heat treatment temperature in the process (d).

As just described, by making the temperature at which the silicon epitaxial layer is grown higher than the temperature of the heat treatment performed in the previous process, the effects similar to those of the above-described two-stage heat treatment can be expected. That is, at the time of heat treatment in the previous process, the SOI layer is flattened at a relatively low temperature while preventing the generation of slip dislocation, and, by carrying out epitaxial growth at a high temperature, it is possible to efficiently enhance the bonding strength at the bonded interface. This makes it possible to achieve a high-quality SOI substrate that does not suffer from exfoliation in the process that follows.

EXAMPLES

Hereinafter, the present invention will be explained more specifically by way of examples. It is to be understood that the present invention is not limited in any way by the examples described below.

Example 1

As a bond wafer and a base wafer, silicon single crystal wafers, each being 300 mm in diameter and with crystal orientation <100>, were prepared, and a 150-nm-thick silicon dioxide film was formed on the bond wafer. Next, $H^+$ ion-implantation (50 keV, $5\times10^{16}/cm^2$) was performed via the silicon dioxide film, and the bond wafer was bonded to the base wafer at room temperature. Thereafter, the bond wafer was delaminated by heat treatment for delamination at a temperature of 500° C., whereby an SOI substrate was produced.

Figure 2:
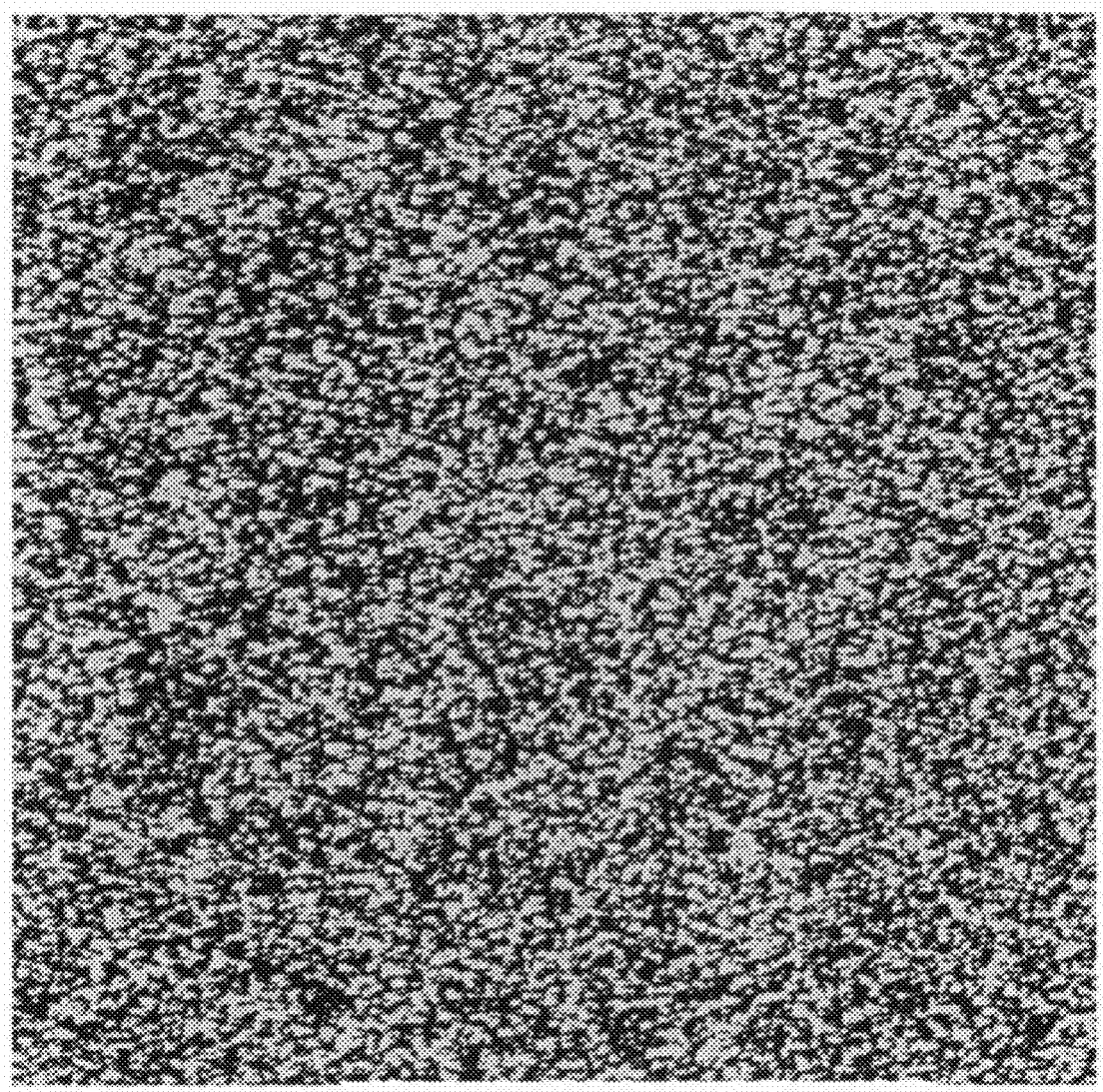
FIG. 2 is an AFM image of the surface of a just-delaminated SOI layer.

The roughness of the SOI layer surface (30 μm×30 μm) at this point was measured by an AFM (atomic force microscope). As a result, the PV value was found to be 47.17 nm, and the RMS value was found to be 4.45 nm. The SOI layer surface observed at this point under the AFM is shown in FIG. 2.

The SOI substrate after delamination was subjected to heat treatment in an atmosphere containing hydrogen chloride gas (HCl treatment) under two different temperature conditions (1100° C. and 1150° C.) by using single wafer reactor system, and the roughness of the surface of the SOI layer subjected to the heat treatment was measured by the AFM. In this case, the heat treatment conditions were as follows: pressure (normal pressure: 760 torr (101.3 kPa)), atmosphere ($H_2$: 40 slm, HCl: 200 sccm), and time (two minutes).

Figure 3:
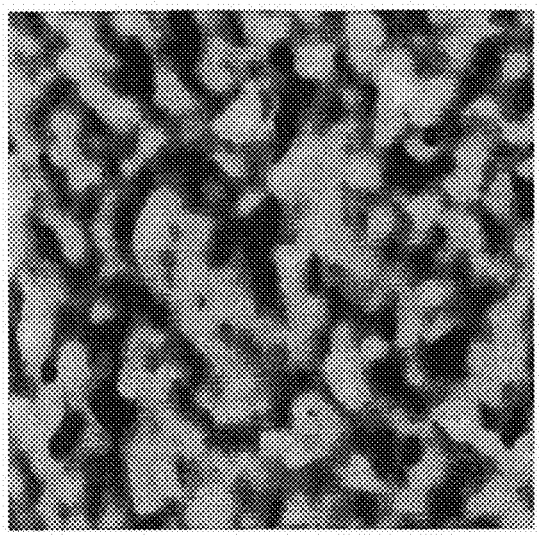
FIG. 3 is an AFM image of the surface of the SOI layer subjected to heat treatment.
Figure 3:
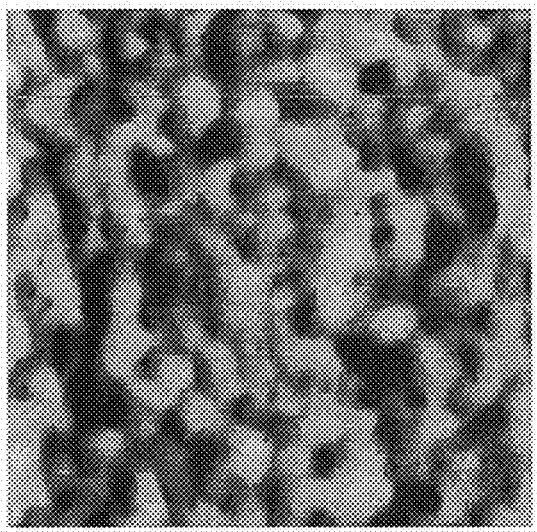

The heat treatment at 1100° C. and the heat treatment at 1150° C. differ only slightly in etching amount and roughness. Under both temperature conditions, the SOI layer was etched to a depth of the order of 20 nm by two-minute treatment. As for the roughness, when the temperature condition was 1100° C., the PV value was 7.40 nm and the RMS value was 0.67 nm; when the temperature condition was 1150° C., the PV value and the RMS value were lowered to 7.20 nm and 0.63 nm, respectively. The SOI layer surfaces observed at this point under the AFM are shown in FIG. 3.

After the SOI layer of the SOI substrate subjected to the heat treatment was flattened by performing CMP (polishing rate: 0.5 nm/sec) under two different polishing conditions, of which one is a condition under which the SOI layer is polished to a depth of 30 nm and the other is a condition under which it is polished to a depth of 100 nm, a 3-μm-thick silicon epitaxial layer was grown on the SOI layer thus obtained. In this case, the silicon epitaxial growth conditions were as follows: pressure (reduced pressure: 80 torr (10.7 kPa)), temperature (1080° C.), and atmosphere ($H_2$: 40 slm, $SiH_2Cl_2$: 450 sccm).

Figure 4:
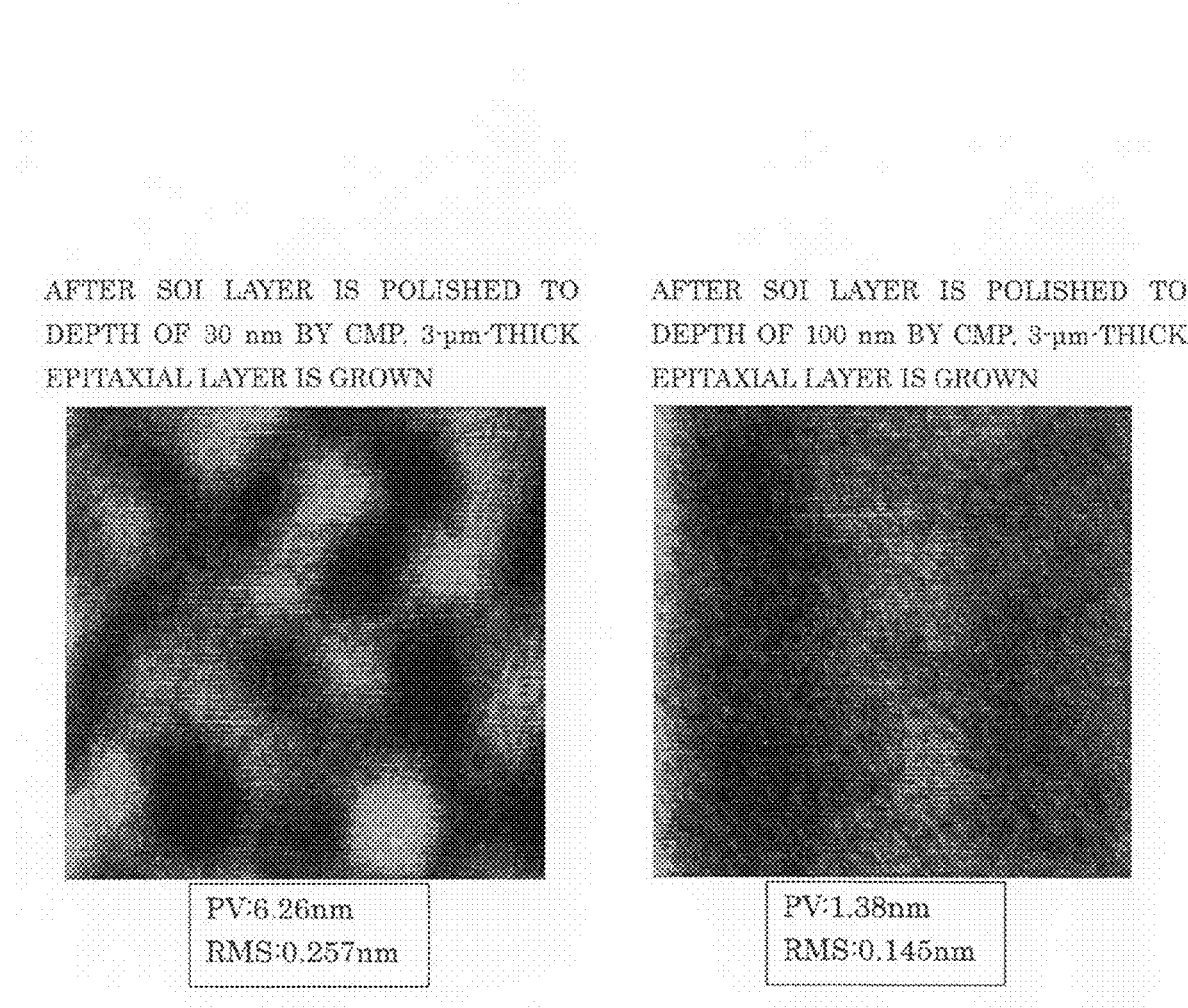
FIG. 4 is an AFM image of the surface of a silicon epitaxial layer.

The roughness of the silicon epitaxial layer surface after epitaxial growth was measured by the AFM. As a result, the substrate polished to a depth of 30 nm was found to have a PV value of 6.3 nm and an RMS value of 0.26 nm, and the substrate polished to a depth of 100 nm was found to have a PV value of 1.4 nm and an RMS value of 0.15 nm. The silicon epitaxial layer surfaces observed at this point under the AFM are shown in FIG. 4.

Incidentally, a normal mirror-polished silicon single crystal wafer (polished wafer) for comparison having a silicon epitaxial layer grown thereon had a PV value of 1.3 nm and an RMS value of 0.11 nm. Therefore, it is considered that performing HCl treatment on the SOI substrate and polishing it to a depth of 100 nm makes it possible to obtain a surface whose flatness is roughly equal to that of the polished wafer. On the other hand, in a separate experiment, it is found out that stock removal of at least 150 nm or more is required in order to obtain the roughness equal to that of the polished wafer only by performing polishing by CMP without performing HCl treatment on the just-delaminated SOI substrate having a high degree of roughness. As just described, improving the surface roughness by HCl treatment or the like before performing polishing by CMP is extremely effective in shortening CMP polishing time and preventing degradation of the SOI film thickness uniformity.

In addition, it is also found out that the wafer to which HCl treatment was performed at 1150° C. suffers slightly from slip dislocation, and a margin for making it slip dislocation free is narrowed as the HCl treatment temperature becomes higher. Incidentally, in this example, a visual inspection for slip dislocation was conducted under a light gathering lamp.

Next, as for the bonding strength at a bonding interface (in this example, corresponding to an interface between the base wafer and the silicon dioxide film (BOX layer) formed on the bond wafer), which is one of the important quality items of the SOI substrate, in this example, an evaluation thereof is performed in a simple and easy way by measuring the HF etching amount (the depth to which HF penetrates) in the BOX layer.

Figure 5:
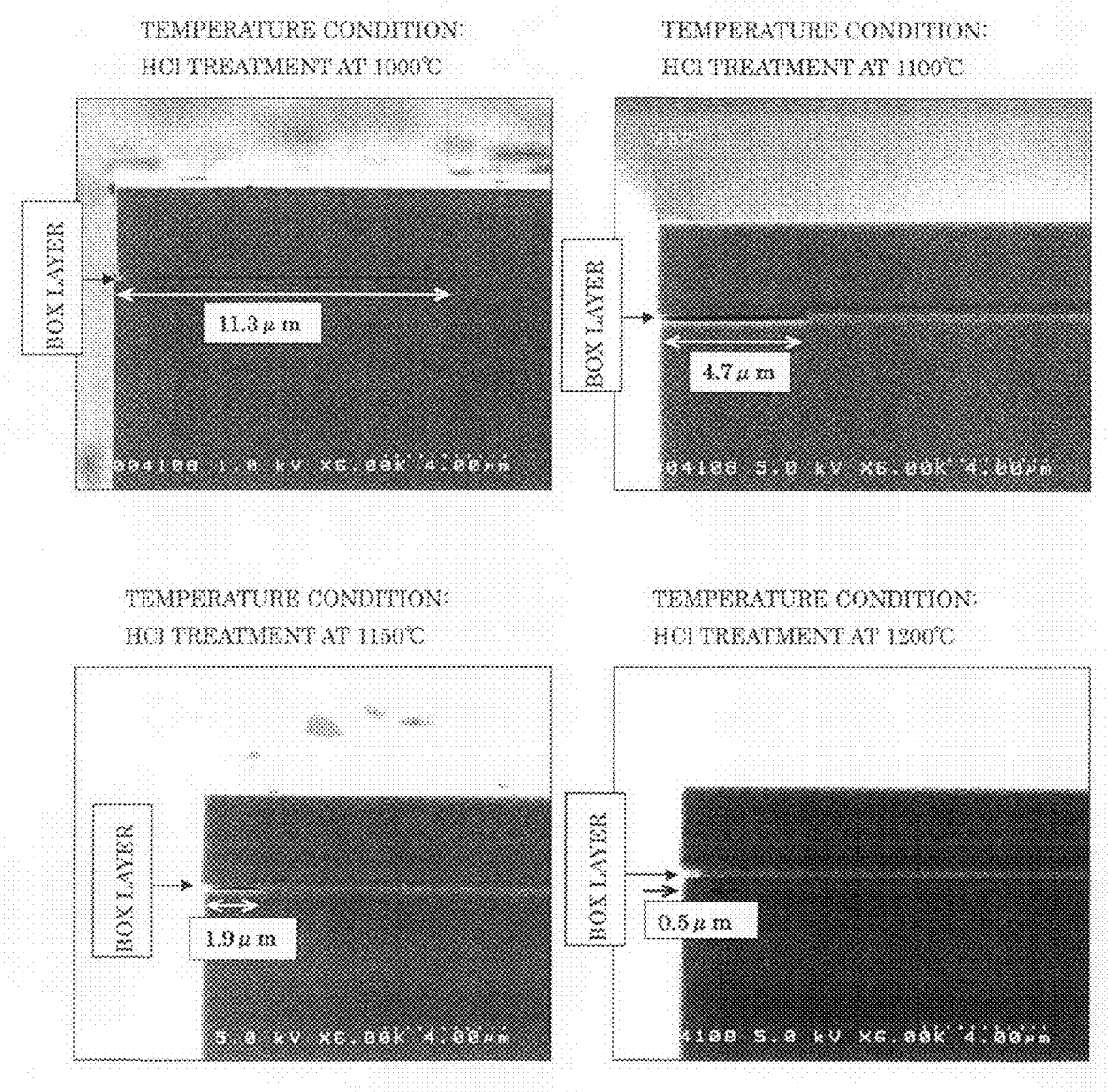
FIG. 5 is an SEM image of a section of an SOI substrate subjected to HF treatment.

Evaluation samples were produced by performing HCl treatment at four different temperature conditions (1000° C., 110° C., 1150° C., and 1200° C.) on the delaminated SOI substrates produced by the ion-implantation delamination method in the manner as described above for 30 seconds, polishing them to a depth of 100 nm by CMP, and then growing a 3-μm-thick silicon epitaxial layer thereon at 1080° C. From each sample wafer, a chip measuring 50 mm×50 mm was cleaved, and the cleavage face was immersed in 15% HF for five minutes. Then, a section thereof was observed by SEM (scanning electron microscopy). SEM images of the sections observed at this point are shown in FIG. 5. An SEM image of a section of the sample wafer subjected to HCl treatment at 1000° C. and an enlarged view thereof are shown in FIG. 6.

According to FIG. 5, it is found out that the depth to which HF penetrates decreases as the HCl treatment temperature increases, and the bonding strength increases accordingly. The absolute value of the depth to which HF penetrates at each treatment temperature is shown in a bar graph (left) of FIG. 7.

Figure 6:
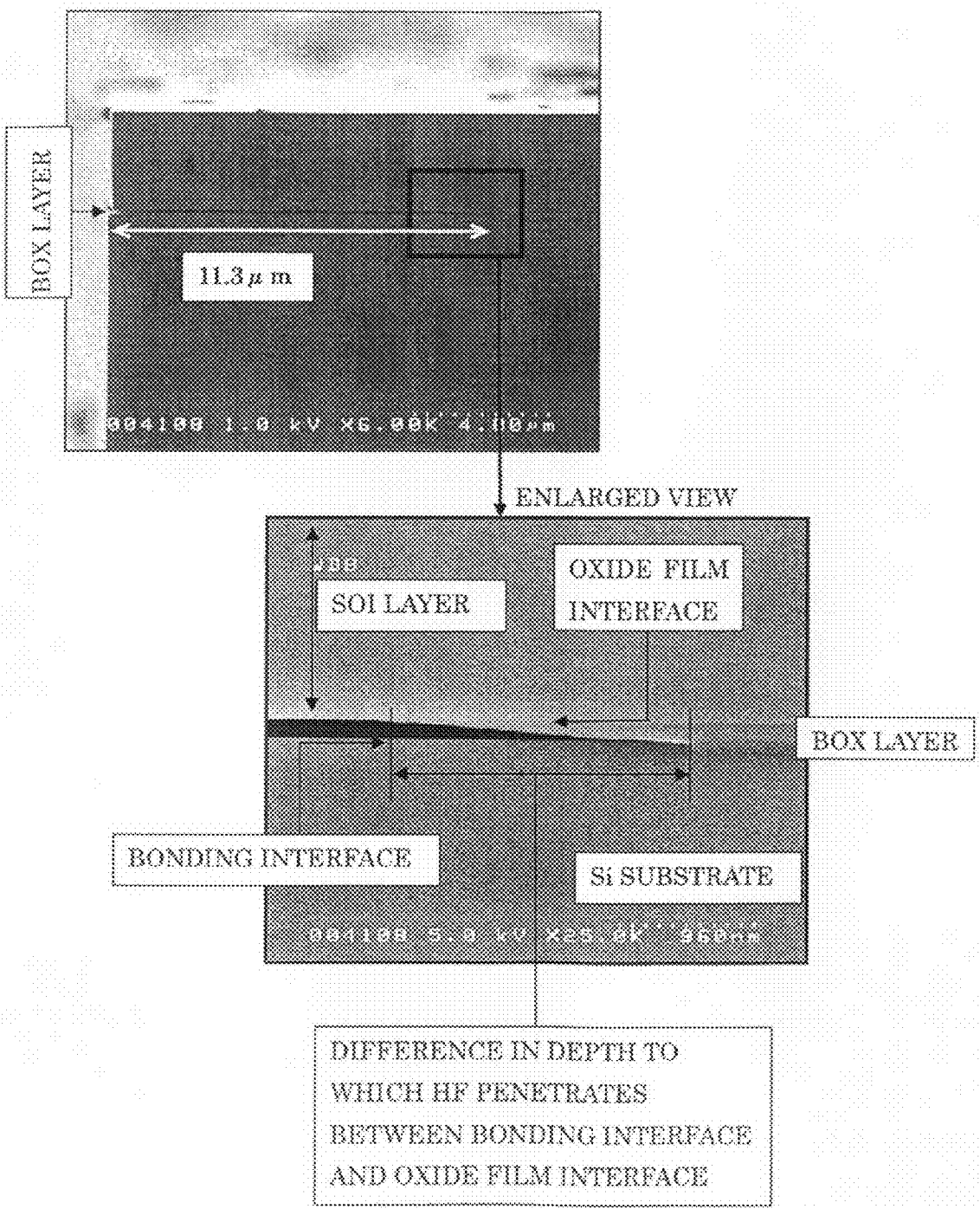
FIG. 6 is an SEM image of a section of an SOI substrate subjected to HCl treatment at 1000° C. and an enlarged view thereof.

The temperature dependence of the bonding strength was confirmed based on a difference between the depth to which HF penetrates on the side of the bonding interface (the side of an interface between the Si substrate and the BOX layer) and that on the side of the oxide film interface (the side of an interface between the SOI layer and the BOX layer) as shown in an SEM image of FIG. 6. In this way, the bonding strength was found to be strongly affected by the treatment temperature. A difference between the depth to which HF penetrates at one interface and that at the other interface at each treatment temperature is shown in a bar graph (right) of FIG. 7.

Figure 7:
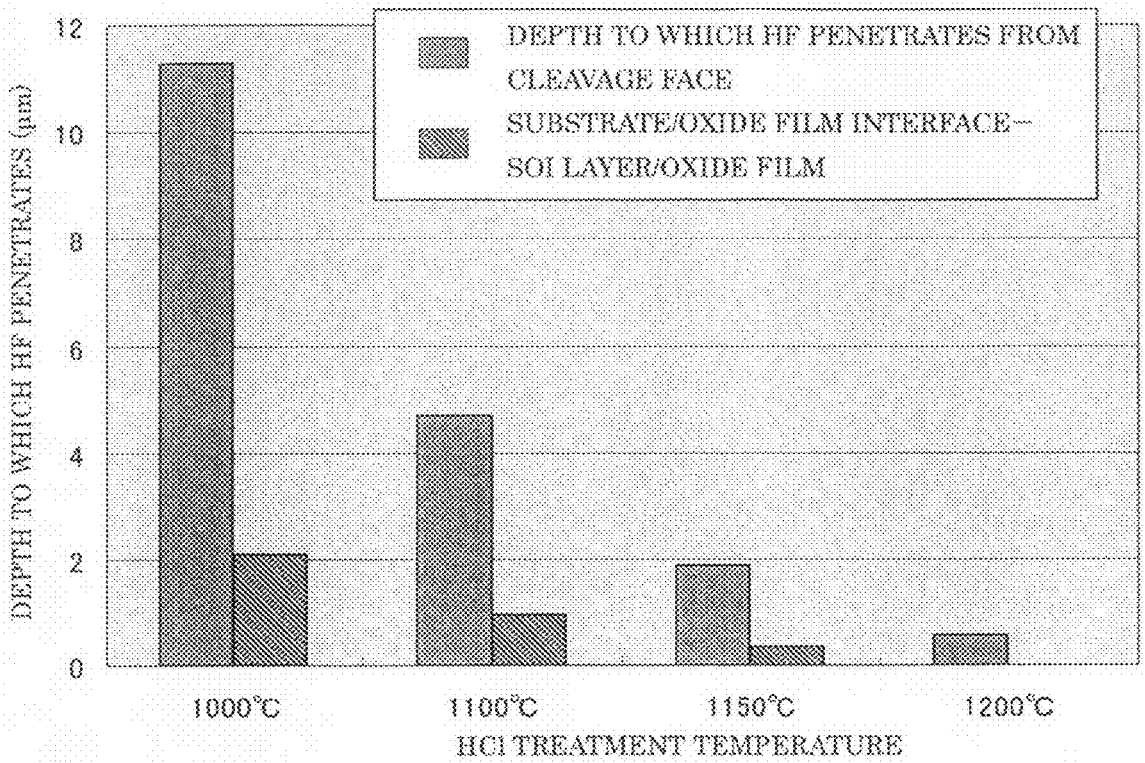
FIG. 7 is a graph of the depth to which HF penetrates.

As shown in FIGS. 5, 6, and 7, it was found to be possible to considerably reduce the penetration of HF by setting the heat treatment temperature at 1100° C. or higher, preferably 1150° C. or higher, and thereby greatly enhance the integrity (that is, the bonding strength) at the bonding interface.

Example 2

In order to enhance the bonding strength at the bonding interface after epitaxial growth as in Example 1, it is preferable that the HCl treatment performed before polishing by CMP be performed at the highest possible temperature. However, caution is required because slip dislocation tends to be generated at 1150° C. or higher.

Therefore, in Example 2, in order to reduce the generation of slip dislocation in HCl treatment, two-stage heat treatment was performed in such a way that, after treatment was performed at 1100° C. for two minutes, the temperature was raised without the SOI substrate being taken out of the equipment so as to treat it at 1150° C. for 30 seconds, and then polishing by CMP and epitaxial growth were performed. After this, an inspection for slip dislocation and an evaluation of the depth to which HF penetrates were conducted under the same conditions as in Example 1.

The results of a visual inspection revealed that the product thus obtained was free from slip dislocation and the depth to which HF penetrates was at a level equivalent to that of the product treated at 1150° C. in Example 1. As in this example, it is preferable that improvement in the roughness of the delaminated SOI surface is achieved by performing treatment at a low temperature of 1100° C. or lower at which slip dislocation is less likely to be generated, and enhancement of the bonding strength is achieved by performing treatment at a high temperature of 1150° C. or higher in a short time. Although, in this example, treatment (HCl treatment) was performed with HCl running constantly during treatment at 1100° C., during temperature rising from 1100° C. to 1150° C., and during treatment at 1150° C., the same result was obtained when a flow of HCl was stopped after HCl treatment at 1100° C. was performed, and then the temperature was raised to 1150° C. such that treatment was performed in an atmosphere of $H_2$ alone.

Example 3

Example 2 proves that performing HCl treatment before CMP at two different temperatures is effective in achieving both an enhancement of the bonding strength at the bonding interface after epitaxial growth and a slip dislocation-free product. The same effect can also be produced by carrying out silicon epitaxial growth at a temperature higher than the HCl treatment temperature.

The SOI substrate produced under the same conditions as in Example 1 was prepared, and HCl treatment was performed thereon at 1100° C. for two minutes. Then, the substrate was flattened by being polished to a depth of 100 nm by CMP. Silicon epitaxial growth was carried out as follows. First, a natural oxide film was removed by treating the substrate in an atmosphere of $H_2$ at 1150° C. for 30 seconds, and then a 3-μm-thick silicon epitaxial layer was grown at 1130° C. The results of an evaluation of the quality of the SOI substrate thus obtained revealed that, as is the case with Example 2, it was free from slip dislocation and the depth to which HF penetrates was at a level equivalent to that of the product obtained in Example 1.

It is to be understood that the present invention is not limited in any way by the embodiment thereof described above. The above embodiment is merely an example, and anything that has substantially the same structure as the technical idea recited in the claims of the present invention and that offers similar workings and benefits falls within the technical scope of the present invention.

What is claimed is:

1. A method for producing an SOI substrate having a thick-film SOI layer, wherein, at least,
   an ion-implanted layer is formed by implanting at least one kind of ion of hydrogen ion and a rare gas ion into a surface of a bond wafer,
   an SOI substrate having an SOI layer is produced by, after the ion-implanted surface of the bond wafer and a surface of a base wafer are bonded together via an oxide film, delaminating the bond wafer along the ion-implanted layer, and
   a thick-film SOI layer is formed by performing a heat treatment on the SOI substrate having the SOI layer in a reducing atmosphere containing hydrogen or an atmosphere containing hydrogen chloride gas, after performing the heat treatment, polishing a surface of the SOI layer by CMP, and after the polishing, growing a silicon epitaxial layer on the SOI layer of the SOI substrate.

2. The method for producing an SOI substrate having a thick-film SOI layer according to claim 1, wherein
   after particle measurement is carried out for the SOI layer of the SOI substrate having the SOI layer polished by CMP so as to determine a quality thereof, for a substrate judged to be a non-defective product, the silicon epitaxial layer is grown on the SOI layer, and for a substrate judged to be a defective product, the surface of the SOI layer is re-polished by CMP, and particle measurement is carried out again for the SOI layer so as to determine a quality thereof.

3. The method for producing an SOI substrate having a thick-film SOI layer according to claim 1, wherein
   a temperature at which the silicon epitaxial layer is grown is made higher than a temperature of the heat treatment.

4. The method for producing an SOI substrate having a thick-film SOI layer according to claim 3, wherein
   after particle measurement is carried out for the SOI layer of the SOI substrate having the SOI layer polished by CMP so as to determine a quality thereof, for a substrate judged to be a non-defective product, the silicon epitaxial layer is grown on the SOI layer, and for a substrate judged to be a defective product, the surface of the SOI layer is re-polished by CMP, and particle measurement is carried out again for the SOI layer so as to determine a quality thereof.

5. The method for producing an SOI substrate having a thick-film SOI layer according to claim 1, wherein
   the heat treatment is performed at 1000° C. or higher.

6. The method for producing an SOI substrate having a thick-film SOI layer according to claim 5, wherein
   after particle measurement is carried out for the SOI layer of the SOI substrate having the SOI layer polished by CMP so as to determine a quality thereof, for a substrate judged to be a non-defective product, the silicon epitaxial layer is grown on the SOI layer, and for a substrate judged to be a defective product, the surface of the SOI layer is re-polished by CMP, and particle measurement is carried out again for the SOI layer so as to determine a quality thereof.

7. The method for producing an SOI substrate having a thick-film SOI layer according to claim 5, wherein as the heat treatment, first-stage heat treatment performed at 1000 to 1100° C. and second-stage heat treatment performed at a temperature higher than 1100° C. are performed in a continuous manner.

8. The method for producing an SOI substrate having a thick-film SOI layer according to claim 7, wherein after particle measurement is carried out for the SOI layer of the SOI substrate having the SOI layer polished by CMP so as to determine a quality thereof, for a substrate judged to be a non-defective product, the silicon epitaxial layer is grown on the SOI layer, and for a substrate judged to be a defective product, the surface of the SOI layer is re-polished by CMP, and particle measurement is carried out again for the SOI layer so as to determine a quality thereof.

9. The method for producing an SOI substrate having a thick-film SOI layer according to claim 8, wherein a temperature at which the silicon epitaxial layer is grown is made higher than a temperature of the heat treatment.

10. The method for producing an SOI substrate having a thick-film SOI layer according to claim 9 wherein after particle measurement is carried out for the SOI layer of the SOI substrate having the SOI layer polished by CMP so as to determine a quality thereof, for a substrate judged to be a non-defective product, the silicon epitaxial layer is grown on the SOI layer, and for a substrate judged to be a defective product, the surface of the SOI layer is re-polished by CMP, and particle measurement is carried out again for the SOI layer so as to determine a quality thereof.

11. The method for producing an SOI substrate having a thick-film SOI layer according to claim 5, wherein a temperature at which the silicon epitaxial layer is grown is made higher than a temperature of the heat treatment.

12. The method for producing an SOI substrate having a thick-film SOI layer according to claim 11, wherein after particle measurement is carried out for the SOI layer of the SOI substrate having the SOI layer polished by CMP so as to determine a quality thereof, for a substrate judged to be a non-defective product, the silicon epitaxial layer is grown on the SOI layer, and for a substrate judged to be a defective product, the surface of the SOI layer is re-polished by CMP, and particle measurement is carried out again for the SOI layer so as to determine a quality thereof.

\* \* \* \* \*